United States Patent [19]
Radloff et al.

[11] Patent Number: 5,532,428
[45] Date of Patent: Jul. 2, 1996

[54] SNAP-IN RESILIENT EMI GROUNDING CLIP APPARATUS FOR COMPUTER STRUCTURES

[75] Inventors: Timothy Radloff; Robert Garrett, both of Austin, Tex.

[73] Assignee: Dell USA, L.P., Austin, Tex.

[21] Appl. No.: 216,910

[22] Filed: Mar. 23, 1994

[51] Int. Cl.[6] ........................................ H05K 9/00
[52] U.S. Cl. .................. 174/35 GC; 174/51; 338/176; 361/816
[58] Field of Search ................. 174/356 C, 51; 338/176; 361/816; 229/52 A, 117

[56] References Cited

U.S. PATENT DOCUMENTS

| | | | |
|---|---|---|---|
| 3,625,410 | 12/1971 | Hirschey | 229/16 R |
| 4,784,265 | 11/1988 | Gitlitz et al. | 206/423 |
| 5,120,903 | 6/1992 | Tam | 174/35 GC |
| 5,225,629 | 6/1993 | Garrett | 174/35 R |
| 5,313,016 | 5/1994 | Brusati et al. | 174/35 GC |

*Primary Examiner*—Kristine L. Kincaid
*Assistant Examiner*—Michael J. Cornelison
*Attorney, Agent, or Firm*—Henry N. Garrana; Mark P. Kahler; Michelle M. Turner

[57] ABSTRACT

To reliably maintain an EMI grounding connection between a sheet metal computer chassis wall and a computer cover wall that may be removably placed against the outer side of the chassis wall, a lance structure is formed in the chassis wall, and opposing installation notches are formed in the chassis wall on opposite sides of the lance opening. Transversely enlarged end portions of an elongated arcuate sheet metal grounding strip are inserted inwardly through the wall notches and captively retained within the lance structure with a longitudinally intermediate portion of the arcuate strip body extending outwardly through the chassis wall lance opening. When the cover wall is operatively installed on the chassis wall the grounding strip is resiliently flattened and compressed between the lance strip and the installed cover wall to maintain an EMI grounding path between the contiguous chassis and cover walls.

11 Claims, 2 Drawing Sheets

5,532,428

SNAP-IN RESILIENT EMI GROUNDING CLIP APPARATUS FOR COMPUTER STRUCTURES

BACKGROUND OF THE INVENTION

This invention generally relates to apparatus for creating an EMI grounding path between two adjacent electronic system structures and, in a preferred embodiment thereof, more particularly relates to EMI grounding clip apparatus for maintaining a grounding path between two adjacent computer components such as a computer chassis wall and an associated computer cover wall.

In the past, many different spring-type clips have been used to create and maintain good electrical grounding contact between a carrier wall portion of a first electronic system structure and an adjacent wall portion of a second electronic system structure. Many of the existing spring clip designs attach to the carrier part by fitting over one of the edges of the part, or an edge created by punching a hole in the part. Typically, in this type of design, a portion of the spring clip is sandwiched between the mating surfaces of the two structures. The biggest disadvantage to this class of design is that adjustments must be made to the design of the carrier part and the mating part to compensate for the additional material thickness of the spring clip between them. Also, if not properly designed, the spring clip can be overstressed and permanently deformed.

An improvement on this general type of grounding clip design is illustrated and described in U.S. Pat. No. 5,225,629 to Garrett. This EMI clip snaps into place on the carrier part. The key difference in this design is that it attaches only to the interior surface of the carrier part without any portion of the clip being sandwiched between the mating surfaces of the two parts to be grounded by the clip. Spring fingers that protrude through holes punched in the carrier part make contact with the mating part, but they can displace to a position that is flush with the outer surface of the carrier part.

The main drawback to this EMI clip is that it must be placed in the carrier part where there is a bend in the sheet metal. Often, these spring clips are complex in shape. Also, the physical shape and size of the clip are dependent on the specific geometry of the mating parts. Accordingly, each pair of differently configured parts that must be grounded to one another may require a separate grounding clip design.

In view of the foregoing it can be readily seen that it would be desirable to provide a grounding clip structure, and associated mounting structure, which will eliminate or at least substantially minimize the above-mentioned problems, limitations and disadvantages commonly associated with conventionally designed grounding clip structures. It is accordingly an object of the present invention to provide such an improved grounding clip and associated mounting structure.

SUMMARY OF THE INVENTION

In carrying out principles of the present invention, in accordance with a preferred embodiment thereof, apparatus is provided for creating an electrically conductive grounding path between a first structure having a wall portion with first and second opposite sides, and a second structure positionable against the first wall portion side.

The apparatus comprises a lance structure formed on the first structure wall portion and including an opening extending through the wall portion, and a lance strip section of the wall portion outwardly offset from the second side thereof over said opening therein. A resiliently deflectable, electrically conductive grounding strip is longitudinally curved along its length and has opposite end portions captively retained between the second wall portion side and the lance strip section for movement toward and away from the opposite ends of the lance strip section, and a curved longitudinally intermediate portion extending through the wall portion opening and projecting outwardly beyond the first wall portion side.

The grounding strip and the two structures it is used with are representatively formed from sheet metal, the two structures illustratively being a computer chassis and a cover structure removably mounted thereon. In a preferred embodiment thereof, the grounding strip is in the form of a resiliently deflectable, electrically conductive grounding clip member for use in creating a grounding path between two objects. The grounding clip member has an elongated strip-like body longitudinally curved about a first axis and concavely facing in a first direction transverse to the first axis. The body has opposite end portions curved about second and third axes parallel to the first axis and concavely facing in second directions generally opposite to the first direction. The opposite end portions of the body are transversely enlarged, in directions parallel to the second and third axes, relative to the balance of the body. To facilitate insertion of the transversely enlarged clip member end portions into the space between the wall portion and its associated lance strip section, notch means are preferably formed in the wall portion, at the periphery of its lance opening, and are dimensioned to permit the enlarged clip member end portions to be passed inwardly therethrough.

DETAILED DESCRIPTION

Figure 2:
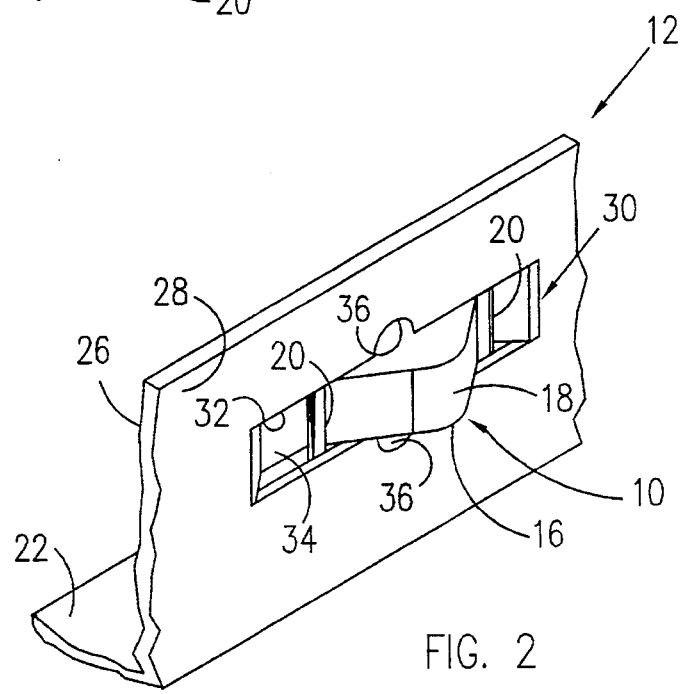
FIG. 2 is an outer side perspective view of a representative computer chassis portion on which the grounding clip member is operatively installed.
Figure 3:
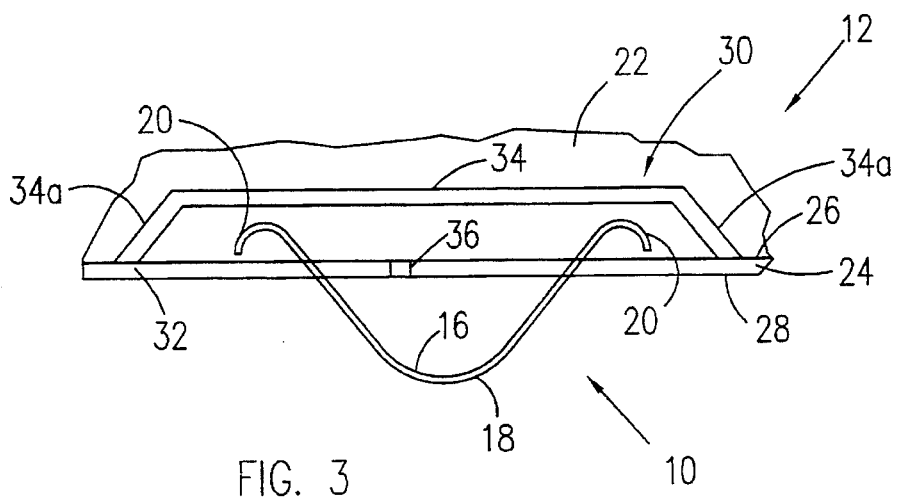
FIG. 3 is a top plan view of the computer chassis portion.
Figure 4:
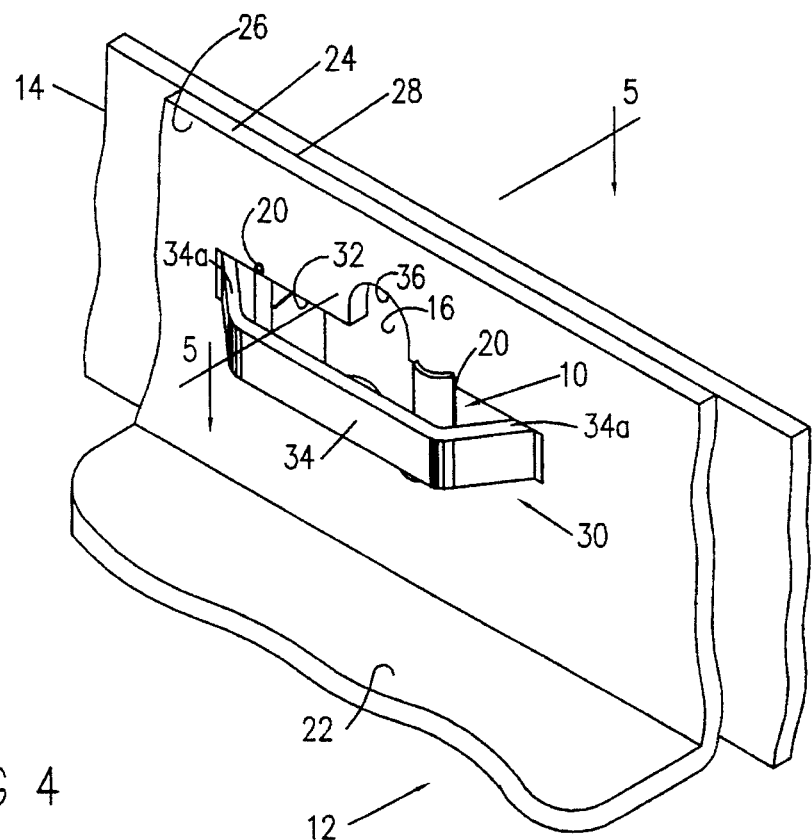
FIG. 4 is an inner side perspective view of the computer chassis portion with the grounding clip member operatively engaging a computer cover wall removably associated with the chassis portion.
Figure 5:
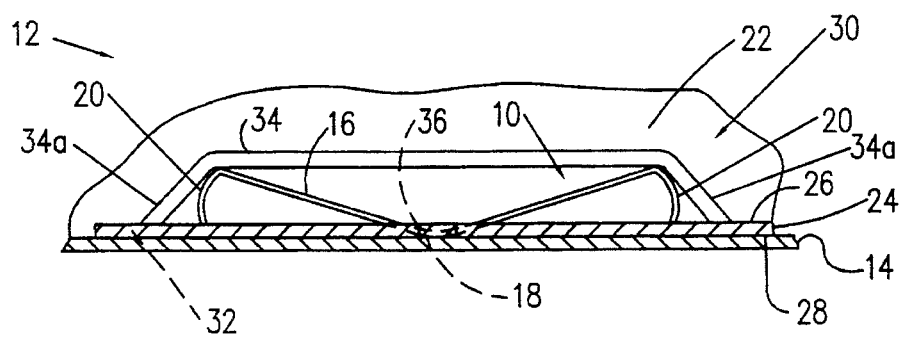
FIG. 5 is a cross-sectional view taken through the chassis portion and cover wall along line 5—5 of FIG. 4.

The present invention provides a specially designed resilient EMI grounding clip member 10 (see FIG. 1) that may be used to provide a reliable electrical grounding contact connection between two computer structures (or other structures needing a grounding path therebetween) such as a chassis portion 12 shown in FIGS. 2–5 and an associated computer cover wall portion 14 shown in FIGS. 4–5 and positionable against the chassis portion.

Figure 1:
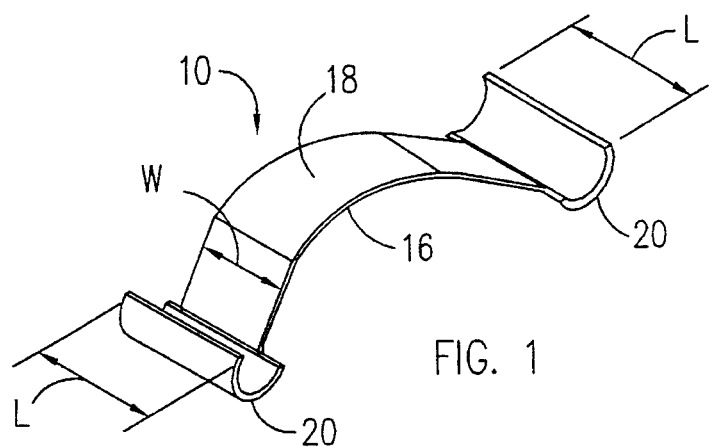
FIG. 1 is a perspective view of a specially designed resilient EMI grounding clip member embodying principles of the present invention.

Referring to FIG. 1, the grounding clip member 10 is formed from a resiliently bendable sheet metal material and has an arcuate, elongated rectangular body portion 16 with a longitudinally intermediate outer side surfaced portion 18, and a width W. Disposed at the opposite ends of the arcuate body 16 are arcuately cross-sectioned end portions 20 of the clip member that extend transversely to the body 16 and have lengths L greater than the body width W. As illustrated, the open sides of the end portions 20 generally face in the same direction as the outer body side surface 18.

As illustrated in FIGS. 2 and 4, the chassis portion 12 is formed from sheet metal and includes a horizontal base wall 22, and a vertical side wall 24 having inner and outer side surfaces 26,28. The computer cover wall portion 14 (see FIG. 4) is representatively of a sheet metal or metal-clad plastic construction and is removably positioned against the outer side 28 of the chassis wall in a parallel relationship therewith by sliding the cover wall portion 14 outwardly along the chassis wall 24 during installation of the overall computer housing cover structure.

The vertical chassis side wall 24 has a lance structure 30 formed therein and including a horizontally elongated rectangular wall opening 32, and a corresponding metal lance strip section 34 projecting inwardly beyond the inner chassis wall side surface 26 over the wall opening 32. The vertical width of the wall opening 32 is slightly greater than the clip body width W, but is less than the end portion lengths L. Vertically opposed arcuate installation notches 36 are formed in the chassis wall 24 at horizontally intermediate portions of the top and bottom sides of the wall opening 32.

Referring now to FIG. 3, the grounding clip member 10 is installed on the lance structure 30 by pushing the transversely enlarged clip member end portions 20 inwardly through the installation notches 36 to captively retain the end portions 20 between the wall 24 and the metal lance strip 34, and the arcuate clip member body portion 16 projecting outwardly through the wall opening 32. As viewed in FIG. 3, this clip member installation may be effected by, for example, pushing the right clip member end portion 20 inwardly through the notches 36, sliding the inserted right end portion 20 toward the right end of the lance strip 34, slightly bending the clip member, inserting the left clip member end portion 20 inwardly through the notches 36, and then releasing the bent clip member 10 to permit it to spring back to its original position shown in FIG. 3. With the clip member 10 installed in this manner, the convex sides of the curved clip member end portions 20 face the lance strip 34.

The clip member 10 and the lance structure 30 are relatively configured in a manner such that the distance between the clip member end portions 20 is less than the distance between the opposite ends 34a of the lance strip 34. Accordingly, when the computer cover wall 14 is slid along the outer side of the chassis wall 24 to its installed position as shown in FIGS. 4 and 5, the previously mounted grounding clip member 10 is pushed by the cover wall 14 inwardly toward the lance strip 34 in a manner flattening the clip body 16 and pushing its captively retained transverse end portions 20 toward the opposite ends 34a of the lance strip 34 as best illustrated in FIG. 5.

With the clip member 10 in this resiliently bent operating orientation, the clip member ends 20 are held in forcible engagement with opposite end portions of the lance strip 34, and the central outer side surface portion 18 of the clip member body 16 forcibly engages the inner side surface of the cover wall 14 which is positioned against the outer side surface 28 of the chassis wall 24. The resiliently deformed clip member 10 thus reliably maintains an EMI grounding path between the chassis and cover walls 24 and 14. When the cover wall 14 is removed from the chassis portion 12, the grounding clip 10 springs back to its FIG. 3 position.

The grounding clip 10, and its associated lance mounting structure 30, are simple and inexpensive to fabricate and install, and provide a variety of advantages over conventional grounding clip designs. For example, the grounding clip 10 does not have to be mounted on an angled portion of the wall 24 - it may be mounted on any flat portion thereof. Additionally, as may be best seen in FIG. 5, the clip member 10 is not interposed between the mating surfaces of the contiguous walls 14 and 24 during use of the clip. Accordingly, these walls do not have to be specially contoured to provide clip clearance space therebetween. Moreover, due to the method used in mounting the clip 10, it is not permanently deformed during use thereof. It will spring back to its original FIG. 3 configuration when the cover wall 14 is removed from the chassis portion 12.

The foregoing detailed description is to be clearly understood as being given by way of illustration and example only, the spirit and scope of the present invention being limited solely by the appended claims.

What is claimed is:

1. Apparatus for creating an electrically conductive grounding path between a first structure having a wall portion with first and second opposite sides, and a second structure positionable against said first wall portion side, said apparatus comprising:

a lance structure formed on said wall portion and including an opening extending through said wall portion and an elongated lance strip section of said wall portion outwardly offset from said second side thereof over said opening therein, said lance strip section having an edge periphery configuration substantially identical to that of said opening; and an elongated, resiliently deflectable, electrically conductive grounding strip longitudinally curved along its length and having opposite end portions captively retained between said second wall portion side and said lance strip section for movement toward and away from opposite ends of said lance strip section, and a curved longitudinally intermediate portion extending through said wall portion opening and projecting outwardly beyond said first wall portion side, said wall portion opening having an elongated rectangular configuration With a length generally parallel to the length of said lance strip section, and a width extending between opposite parallel sides of said opening, said grounding strip end portions being transversely enlarged, in the direction of said width, to lengths greater than said width, and said wall portion having notch means formed therein at a longitudinally intermediate portion of said opening, said notch means permitting passage therethrough of said transversely enlarged grounding strip end portions into and out of the space between said lance strip section and said second side of said wall portion.

2. The apparatus of claim 1 wherein:

said wall portion and said grounding strip are of sheet metal materials.

3. The apparatus of claim 1 wherein:

said first structure is a computer chassis structure.

4. The apparatus of claim 1 wherein said notch means include:

first and second opposite notches formed in said wall portion at longitudinally central portions of said opposite parallel sides of said wall portion opening.

5. Apparatus for creating an electrically conductive grounding path between a first structure having a wall portion with first and second opposite sides, and a second structure positionable against said first wall portion side, said apparatus comprising:

a lance structure formed on said wall portion and including an opening extending through said wall portion and a lance strip section of said wall portion outwardly offset from said second side thereof over said opening therein, said lance strip section having an edge periphery configuration substantially identical to that of said opening; and a resiliently deflectable, electrically conductive grounding strip longitudinally curved along its length and having opposite end portions captively retained between said Second wall portion side and said lance strip section for movement toward and away from opposite ends of said lance strip section, and a curved longitudinally intermediate portion extending through said wall portion opening and projecting outwardly beyond said first wall portion side, said grounding strip being longitudinally curved about a first axis transverse to the length of said grounding strip, and concavely facing said lance strip section, and said opposite end portions of said grounding strip being transversely enlarged, relative to the balance of said grounding strip, in directions parallel to said first axis.

6. The apparatus of claim 5 wherein:

said opposite end portions of said grounding strip are curved about second and third axes parallel to said first axes and concavely face away from said lance strip section.

7. A method of creating an electrical grounding connection between a first structure having a wall portion with first and second opposite sides, and a second structure positionable against said first wall portion side, said method comprising the steps of:

forming a lance structure in said wall portion, said lance structure including an opening extending through said wall portion and a lance strip section of said wall portion outwardly offset from said second side thereof over said opening therein and having an edge periphery configuration substantially identical to that of said opening;

providing a resiliently deflectable, electrically conductive grounding strip which is longitudinally curved along its length, about an axis transverse to said length, and has spaced apart opposite end portions;

mounting said grounding strip on said wall portion by captively retaining said opposite end portions of said grounding strip within the space between said second wall portion side and said lance strip section, for movement therein parallel to the length of said lance strip section, with a curved longitudinally intermediate portion of said grounding strip extending outwardly through said wall portion opening past said first side thereof; and positioning said second structure against said first wall portion side in a manner causing said second structure to forcibly engage and resiliently deflect said longitudinally intermediate grounding strip portion toward said lance strip section and further separate said grounding strip end portions from one another, said wall portion opening having opposite, generally parallel sides, said wall portion having opposed notches formed therein along said opposite sides of said wall portion opening, said opposite end portions of said grounding strip being transversely enlarged relative to the balance of said grounding strip, and said captively retaining step including the step of inserting said grounding strip end portions inwardly through said wall portion opening at said opposed notches.

8. Computer apparatus comprising:

a computer chassis wall having first and second opposite sides and a lance structure formed thereon, said lance structure including an opening extending through said chassis wall, and a lance strip section of said chassis wall outwardly offset from said second side thereof over said opening therein, said lance strip having an edge periphery configuration substantially identical to that of said opening;

a computer cover wall having a first side positioned generally against said first side of said chassis wall over said opening in said chassis wall;

a resiliently deflectable, electrically conductive grounding strip having opposite end portions captively retained in the space between said second chassis wall side and said lance strip section and forcibly engaging said lance strip section, said opposite end portions of said grounding strip being transversely enlarged relative to the balance of said grounding strip, and a curved longitudinally intermediate portion extending through said chassis wall opening and forcibly engaging said first side of said cover wall; and notch means, formed in said chassis wall at the periphery of said opening therein, for facilitating insertion and removal of said transversely enlarged grounding strip end portions into and from the space between said lance strip section and said second chassis wall side through said chassis wall opening.

9. The computer apparatus of claim 8 wherein:

said grounding strip is formed from sheet metal.

10. The computer apparatus of claim 8 wherein:

said chassis wall opening has a pair of opposite sides extending generally parallel to the length of said lance strip section, and said notch means include an opposed pair of notches formed in said chassis wall at intermediate portions of said opposite chassis wall opening sides.

11. The computer apparatus of claim 8 wherein:

said transversely enlarged opposite end portions of said grounding strip are curved and have convex sides bearing against said lance strip section.

* * * * *